US 7,084,706 B2

(12) United States Patent
Minichshofer

(10) Patent No.: US 7,084,706 B2
(45) Date of Patent: Aug. 1, 2006

(54) CIRCUITRY AND METHOD FOR ACCELERATED SWITCHING OF AN AMPLIFIER

(75) Inventor: Juergen Minichshofer, Linz (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/200,645

(22) Filed: Aug. 10, 2005

(65) Prior Publication Data

US 2006/0033578 A1 Feb. 16, 2006

Related U.S. Application Data

(63) Continuation of application No. PCT/EP04/00520, filed on Jan. 22, 2004.

(30) Foreign Application Priority Data

Feb. 10, 2003 (DE) .................. 103 05 366

(51) Int. Cl.
*H03F 3/04* (2006.01)

(52) U.S. Cl. .................. 330/288; 330/296
(58) Field of Classification Search ........... 330/288, 330/285, 296; 323/315, 316
See application file for complete search history.

(56) References Cited

U.S. PATENT DOCUMENTS 5,637,993 A * 6/1997 Whitney et al. .......... 323/315
6,137,366 A 10/2000 King
6,191,656 B1 * 2/2001 Nadler .................. 330/288
6,346,854 B1 2/2002 Heithoff
6,414,553 B1 * 7/2002 Luo ..................... 330/296
6,438,364 B1 8/2002 Waite
6,816,017 B1 11/2004 Yamashita et al.
2002/0024390 A1 2/2002 Yamashita et al.

FOREIGN PATENT DOCUMENTS

DE 101 21 168 A1 11/2002
EP 1 079 533 A1 2/2001
WO WO 02/19519 A1 3/2002

* cited by examiner

*Primary Examiner*—Henry Choe
(74) *Attorney, Agent, or Firm*—Maginot, Moore & Beck

(57) ABSTRACT

A circuitry comprises an amplifier with a bipolar transistor, whose base terminal is coupled to an input terminal for a signal to be amplified. A biasing means for setting a potential at the base terminal of the bipolar transistor is provided. Further, a means for providing such a current to the base terminal of the bipolar transistor is provided, so that a charging or discharging current to the input terminal is larger than a base current of the bipolar transistor. Further, the circuitry comprises a means for detecting whether a potential change at the base terminal of the bipolar transistor is to be effected for switching the bipolar transistor, and a means for connecting the means for providing the current to the base of the bipolar transistor when a potential change is to be effected at the base terminal of the bipolar transistor.

20 Claims, 4 Drawing Sheets

CIRCUITRY AND METHOD FOR ACCELERATED SWITCHING OF AN AMPLIFIER

CROSS-REFERENCE TO RELATED APPLICATION

This application is a continuation of copending International Application No. PCT/EP04/000520, filed Jan. 22, 2004, which designated the United States and was not published in English.

BACKGROUND OF THE INVENTION

Field of the Invention

The present invention relates to a circuitry and a method for accelerated switching of an amplifier and particularly to such a circuitry and such a method suitable for accelerated switching of a low noise amplifier (LNA), which has an external LC sump for improving the IIP3 (IIP3=input intercept point 3).

In known low noise amplifiers, which are usually set up in a common emitter circuit, it is a common technique for reducing distortions to use an external LC sump. Thereby, the external LC sump serves to improve the IIP3, i.e. the so-called third-order intercept point. This IIP3 represents an intersection of the tangent to the curves with a slope of 1 dB/db (fundamental wave) and 3 dB/dB ($3^{rd}$ harmonic), which is to lie within a range in the power transmission diagram, which is as high as possible in order to keep the influence of the third harmonic on the fundamental wave as low as possible.

Such a known LNA circuit is shown in FIG. 1. The LNA comprises a bipolar transistor T in emitter circuit, whose emitter is at a reference potential (normally ground), while its collector is connected to a voltage supply potential Vcc via a resistor R1 and an inductance L1. A HF (HF=high-frequency) input signal Hfin, which is to be applied to the base of the bipolar transistor T. A resistor R2 is connected between base and collector of the bipolar transistor T to provide a DC bias voltage for the base of the bipolar transistor T. Further, the above-mentioned external LC sump having a series circuit of external inductance $L_{ext}$ and external capacitance $C_{ext}$ is connected between the base of the bipolar transistor T and ground. In FIG. 1, all amplifier chip internal components are illustrated within the marginal line 10.

In a change of state of the LNA shown in FIG. 1, the base potential of the same has to be changed. Thereby, a change of state can be switching on and switching off, respectively, the transistor T, wherein switching on is effected by applying the supply voltage Vcc, while switching off is effected by disconnecting the supply voltage Vcc. A further change of state can consist of switching between several stages of a multistage amplifier, wherein such a multistage amplifier is formed by connecting, several of the circuits shown in FIG. 1 in parallel, by connecting them at the terminals HFin and HFout. In such a case, switching can be performed between several stages by disconnecting and connecting, respectively, one or several of the LNAs.

With every change of the base potential of the transistor T, for example such base potential changes required for changes of state, the external capacitance $C_{ext}$ has to be charge-reversed. In the bias structure shown in FIG. 1, where the bias voltage for the base of the transistor T is provided via the resistor R2, this capacitance $C_{ext}$ can only be charge-reversed with the small base current of the transistor T, which leads to long charge-reverse times in combination with large capacitance values as they are required for improving the IIP3. Thus, the LNA as shown in FIG. 1 has high switching times and is thus not suitable for fast circuits.

In the past, the current consumption only played a minor part with LNAs, so that often simple bias concepts were used, as shown in FIG. 1. There, the switching time is determined by the size of the external capacitance and the charge-reverse current. This charge-reverse current was given by the topology, since the same is the base current of the bipolar transistor of the LNA, and thus it was very small. In known LNAs, no further circuits were used for switching time reduction.

SUMMARY OF THE INVENTION

It is an object of the present invention to provide a circuitry and a method enabling an LNA with reduced switching time.

In accordance with a first aspect, the present invention provides a circuitry, having: an amplifier with a single bipolar transistor whose base terminal is connected to an input terminal for a signal to be amplified; a biasing means for setting a potential at the base terminal of the bipolar transistor; a means for providing such a current to the base terminal of the bipolar transistor that a charging or discharging current to the input terminal is larger than a base current of the bipolar transistor; a means for detecting whether a potential change at the base terminal of the bipolar transistor is to be effected for switching the bipolar transistor; and a means for connecting the means for providing the current to the base of the bipolar transistor when a potential change is to be effected at the base terminal of the bipolar transistor.

In accordance with a second aspect, the present invention provides a method for accelerated switching of an amplifier by effecting a potential change at the base terminal of a bipolar transistor of the same, wherein the base terminal is coupled to an input terminal for an input signal to be amplified, wherein a potential at the base terminal can be set by a biasing means, wherein further a capacitor is coupled to the base terminal, which has to be charged or discharged for switching the amplifier, having the steps of: detecting that a potential change is to be effected at the base terminal of the bipolar transistor; and connecting a means for providing such a current to the base terminal of the bipolar transistor that the capacitor is charged or discharged with a charging or discharging current, which is higher than the base current of the bipolar transistor.

According to the invention, the switching time of an LNA can be reduced significantly, since for charging and discharging, respectively, the external capacity of the external LC sump for reducing distortions (improvement of IIP3 ) a charging and discharging current is used, which is higher than the base current of the bipolar transistor of the LNA. For that purpose, according to the invention, a more expensive, largely process-independent bias concept is used, i.e. the current required for charging and discharging the external capacitor is not preset by the bias current of the bipolar transistor of the LNA.

According to the invention, switching between different operating states of the LNA is preferably based on switching on and off of a reference current Iconst. In preferred embodiments of the present invention, this reference current Iconst causes, via a resistor network, potential changes at the base terminals of both a core transistor of the LNA (i.e. the transistor providing the actual amplification) and a second bipolar transistor whose base terminal is not loaded with the external capacitance. Thereby, the resistor network serves for an exact current reflection between T2 and T1, since it balances out different base currents and thus provides the same $U_{BE}$ voltage at the two transistors.

In principle, the base potential settles at T2 due to the current Iconst and the UBE characteristic curve of the transistor T2 actually connected as diode. Thus, the potential at the base terminal of the second transistor can change fast due to switching on and off of the reference current, which is not the case for the core transistor due to the load with external capacitance. In preferred embodiments of the present invention, potential differences between the base terminals of the transistor occurring thereby are detected by connecting and disconnecting the reference current, in order to connect a further current source, which provides a current to the base of the core transistor and thus a current for quickly charging and discharging the external capacitance. In the non-switching case, thus, the bias of the core transistor is provided via the reference current, the current mirror transistor and the resistor network, while in the switching case an additional current source is connected in order to accelerate charging and discharging, respectively, of the external capacitance.

The inventive concept can be used for switching on and off, respectively, a one-stage LNA and in the same way for switching off and on, respectively, individual stages of an amplifier with several LNA stages, where several LNA stages are connected in parallel, both at the HF input and the HF output.

The present invention provides a concept enabling fast switching between different operating states of LNAs. Advantageously, the inventive bias concept is largely process-independent, since the current for charging and discharging, respectively, the external capacitance does substantially not dependent on the base current of the bipolar transistor of the LNA. Above that, in the inventive concept, the current consumption can be kept at a minimum, since a charging current and a discharging current, respectively, for the external capacitance are only connected if required.

BRIEF DESCRIPTION OF THE DRAWINGS

These and other objects and features of the present invention will become clear from the following description taken in conjunction with the accompanying drawings, in which.

DESCRIPTION OF THE PREFERRED EMBODIMENTS

Figure 1:
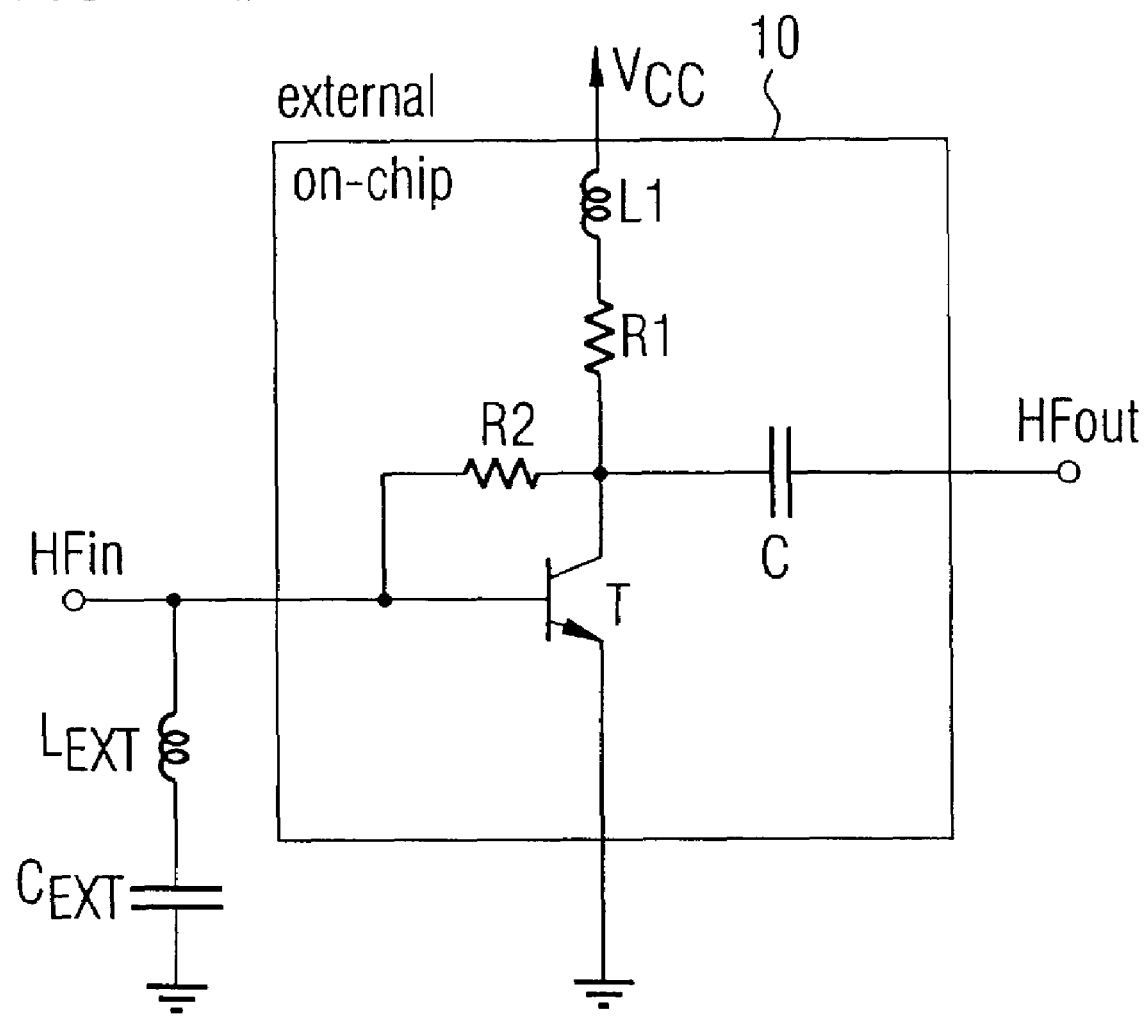
FIG. 1 is a known LNA circuitry.
Figure 2:
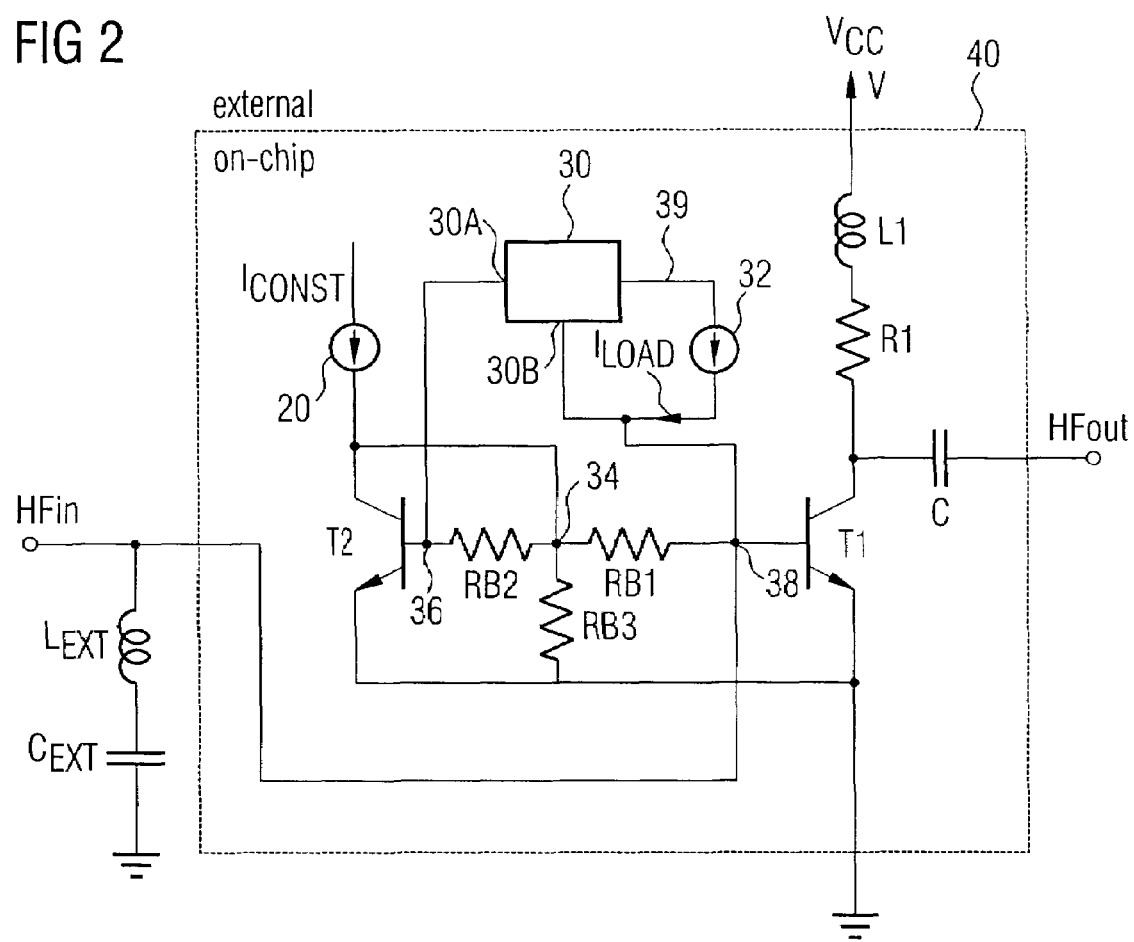
FIG. 2 is circuitry according to an embodiment of the present invention.

An inventive circuitry for a single stage LNA amplifier is shown in FIG. 2. The LNA amplifier comprises a bipolar transistor T1 in emitter circuit, whose emitter is connected to a reference potential, which is normally ground. A supply voltage Vcc can be applied to the collector of the bipolar transistor T via a resistor R1 and an inductance L1. The inductance L1 acts as high-frequency choke and together with the resistor R1 as load. The supply voltage Vcc provides an operating current through the bipolar transistor T1, which is set by the current mirror bias, i.e. by the reference current and the mirror transistor T2 and the resistor network. Further, the collector of the bipolar transistor T1 is connected to an HF output HFout of the LNA via a capacitor C1 serving for DC decoupling.

The base terminal of the bipolar transistor T1 is connected to an HF input HFin of the LNA, wherein an LC sump of external inductance $L_{ext}$ and external capacitance $C_{ext}$ is connected in a known way between the HF input and ground for reducing distortions.

In order to be able to quickly charge and discharge, respectively, this external capacitance $C_{ext}$ in a change of the operating state of the LNA, i.e. when switching on and off the same, respectively, according to the invention, a mostly process independent bias concept is provided, with a bias means, which has a current source 20 for providing a reference current Iconst, a bipolar transistor T2 and a resistor network consisting of three resistors Rb1, Rb2 and Rb3. Further, according to the invention, an additional charging/discharging means is provided for the external capacitance $C_{ext}$, which has a control circuit 30 and a charge current source 32 for providing a charging current Iload to the base terminal of the bipolar transistor T1.

The reference current source 20 is connected to the collector terminal of the bipolar transistor T2 and a circuit node 34 to which the resistors Rb1 and Rb2 are connected. The emitter of the resistor Rb2 is connected to the emitter of the transistor T1, which represents the core transistor of the LNA, and further connected to the circuit node 34 via the resistor Rb3. Alternatively, the core transistor could also be degenerated resistively or inductively. The base terminal of the transistor T2 is connected to the circuit node 34 via the resistor Rb2, while the base terminal of the transistor T1 is also connected to the circuit node 34 via the resistor Rb1.

Thus, in the illustrated embodiment, the transistors T1 and T2 are connected as current mirrors, wherein a defined bias potential can be applied to the base terminals of the transistors T1 and T2 via the resistors Rb1, Rb2 and Rb3 and the current Iconst provided by the reference current source 20.

The base terminal of the transistor T2 representing a further circuit node 36 is connected to a first input 30a of the control circuit 30, while the base terminal of the core transistor T1, which represents a further circuit node 38, is connected to the second input 30b of the control circuit 30. Further, the circuit node 38 is connected to the charging current source 32, which can be controlled via the control circuit 30, as indicated schematically in FIG. 2 by a line 39.

The components, which can advantageously be components of an amplifier chip, are illustrated in FIG. 2 by a dotted peripheral line 40. With regard to the current sources 20 and 32 it has to be noted that they can be realized, for example, by current mirrors fed by a supply voltage Vcc (for example in CMOS technology).

As will be discussed below with reference to FIGS. 3 to 5, the control circuit 30 comprises a detector circuit for detecting a voltage difference and a potential difference, respectively, between the circuit nodes 36 and 38 and a switching logic for controlling the charging current source 32 in dependence on the detected potential difference. Additionally to the charging current source, further, a discharge current sink (not shown in FIG. 2 for clarity reasons) can be provided, which is connected to the circuit node 38 and can also be controlled by the control circuit 30.

In the embodiment of the present invention shown in FIG. 2, switching on and off, respectively, of the core transistor T1 is effected by connecting and disconnecting, respectively, the reference current source 20. The switching on and off, of the reference current Iconst effected thereby, changes the base potential at the transistor T2, i.e. the potential at the circuit node 36 and further the base potential at the transistor T1, i.e. at the circuit node 38. While the base potential can change only slowly at the transistor T1 due to the external capacitance $C_{ext}$, since e only a relatively small base current of the transistor T1 is available for that, the base potential at the transistor T2 can change fast, since no external capacitance has to be reverse-charged. Since thus a potential change is effected faster at the circuit node 36 than at the circuit node 38, a potential difference results between these circuits nodes, which can be used for detecting the state of charge of the external capacitance $C_{ext}$. Depending on the detection of the state of charge, the additional current source 32 can be activated, which provides a current which is significantly larger than the normal charging current (corresponding to the base current of the transistor T1) and thus significantly accelerates the reverse charge time of the external capacitance $C_{ext}$.

In a switched-off state of the LNA, the reference current source 20 is switched off and both bases of the transistors T1 and T2 are on a DC potential of 0 V. If the LNA is switched on, i.e. the reference current source 20 is connected and thus the current Iconst is activated, the potential at the circuit node 36 changes fast, since only the base emitter capacitance has to be loaded via the resistor Rb2. The potential at the circuit node 38 and thus at the base of the core transistor T1 changes slowly, since additionally to the base emitter capacitance of the transistor T1, the external capacitance $C_{ext}$ has to be loaded. The resulting voltage difference and the resulting potential difference, respectively, between the two bases of the transistors T1 and T2 is determined by the detector circuit of the control circuit 30, wherein depending on this difference, the current source 32 is connected and thus the current Iload is activated. The amount of the current Iload can be chosen independent of the base current of the transistor T1 and the reference current Iconst, and can thus be dimensioned significantly larger than these, so that the activation of the current source 32 leads to an acceleration of the charging process. By activating the current source 32, a fast potential change is effected at the base of the transistor T1, whereupon the current source 32 is disconnected by the control circuit 30, as soon as no potential difference is present any longer between the bases of the transistors T1 and T2. In order to not affect the operation of the LNA, the current source 32 is preferably to be designed such that it only insignificantly loads the HF input HFin of the LNA in the inactive, i.e. disconnected mode.

The switching elements of the above described inventive circuitry are preferably designed such that the reference current Iconst is significantly lower than the operating current by the transistor T1, since otherwise an unnecessary amount of current would be consumed in the bias branch. Further, the resistor Rb1 has such an high inductance, in the range of several kilohm, that via the same and the resistor Rb3 no power of a high-frequency signal coupled into the base of the transistor T1 gets lost. The resistor Rb3 provides a defined potential in the off mode (ground) at the base of the transistor T2.

Embodiments for the control circuit 30 for connecting and disconnecting, respectively, a current source and a current sink, respectively, for accelerating a switch-on process and/or a switch-off process of an LNA, will be discussed in more detail with reference to FIGS. 3 to 5.

Figure 3:
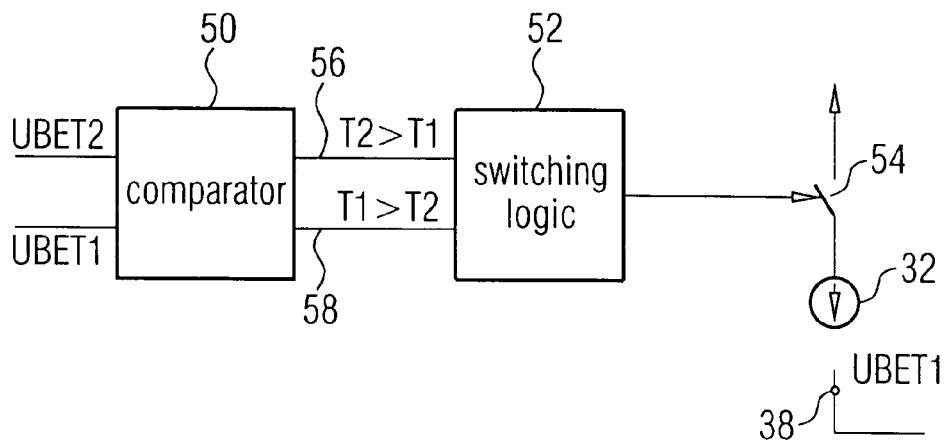
FIGS. 3–5 are embodiments of current controls usable in the inventive circuitry.

In FIG. 3, an embodiment of a control circuit is illustrated, which can be used for accelerating the switch-on process of an LNA. The control circuit comprises a comparator 50, which represents a detector circuit of the control circuit. The output and the outputs, respectively, of the comparator are connected to a switching logic 52, the output of which is again connected to a switch 54 for connecting and disconnecting the charging current source 32.

The comparator 50 receives the potential UbeT1 present at the base of the transistor T1 and the potential UbeT2 present at the base of the transistor T2 at its inputs. The comparator 50 compares the two potentials and outputs a first signal on a comparator output line 56, when the base potential of the transistor T2 is larger than the transistor T1, while the same outputs a second signal on a line 58, when the base potential of the transistor T1 is larger than the base potential of the transistor T2. In the case that merely a switching-on process of the LNA is to be accelerated, the switching logic 52 is designed to close the switch 54 when the comparator outputs the first signal on the comparator output line 56. Thus, the charging current source 32 is connected and charging the circuit node 38 and thus the base of the transistor T1 is effected for so long until the potential UbeT1 at the base of the transistor T1 is no longer smaller than the one at the base of the transistor T2, wherein in that case the switch 54 will be opened.

For a person skilled in the art, it is obvious that the comparator 50 can be designed to output the first signal on the line 56 always when the potential difference between the circuit nodes 36 and 38 is larger than a first threshold, so that the switch 54 is only connected when the potential difference crosses this threshold. Thereby, the comparator can have a hysteresis, so that the signal on the output line 56 is output for so long until the potential difference between the circuit nodes 36 and 38 becomes lower than a second threshold, which can be lower than the first threshold. If merely an acceleration of the switch-on process is to be effected, a second comparator output line 58 is no necessary feature.

Figure 4:
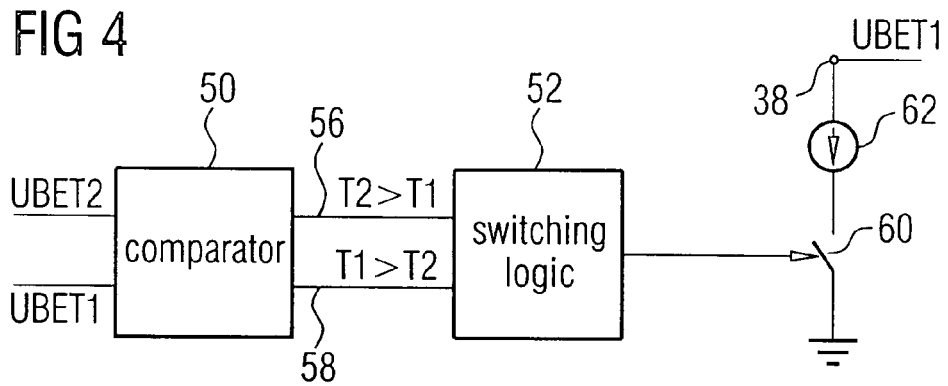

In FIG. 4, an embodiment of an inventive control circuit for accelerating a switch-off process is shown, which again comprises a comparator 50 and a switching logic 52. At the inputs of the comparator 50, the voltages of the circuit nodes 38 and 36 UbeT1 and UbeT2 are applied, wherein the comparator 50 again outputs the signals discussed with reference to FIG. 3, on its output lines 58 and 56. In the embodiment shown in FIG. 4, the switching logic 52 is designed to control a switch 60, when the comparator outputs the second signal on the line 58, in order to connect a discharge current source 62 between the circuit node 38 and ground. This discharging current source 62 effects a fast discharge of the external capacitor $C_{ext}$ by a current of defined current intensity, which corresponds to the current intensity provided by the discharge current source 62. Alternatively, the circuit node 38 can be connected directly to ground to discharge the external capacitor $C_{ext}$ in a switch-off process, and thus to adjust the potential at the base of the transistor T1 quickly to the potential at the base of the transistor T2, wherein, as soon as this is achieved, the switch 60 is opened. As has been described above with reference to FIG. 3, the comparator can again have corresponding thresholds with a corresponding hysteresis.

Figure 5:
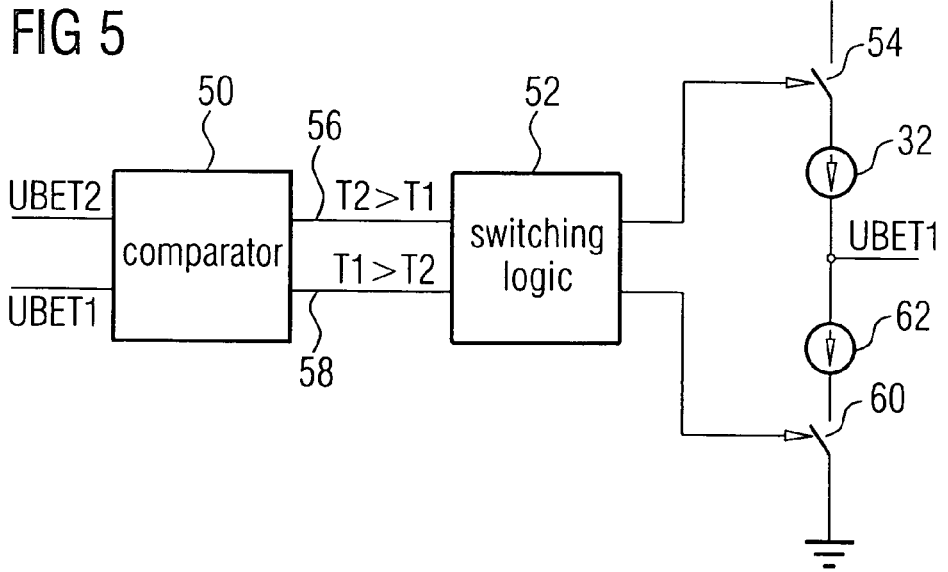

Finally, a control circuit is shown in FIG. 5, where the comparator 50 and the switching logic 52 are designed to realize low switching times both during switching on and switching off. In that case, the comparator 50 outputs both the signal for charging on line 56 and the signal for discharging on line 58, wherein the switching logic 52 is designed to close the switch 54 in the case of the signal for loading on line 56 and to close the switch 60 in the case of the signal for discharging on line 58. Thus, the circuit shown in FIG. 5 illustrates a combination of the circuits described with reference to FIGS. 3 and 4.

It is obvious that the respective position of the switches 54 and 60 is uncritical and that instead of providing an external switch switchable current sources and current sinks, can be used.

Figure 6:
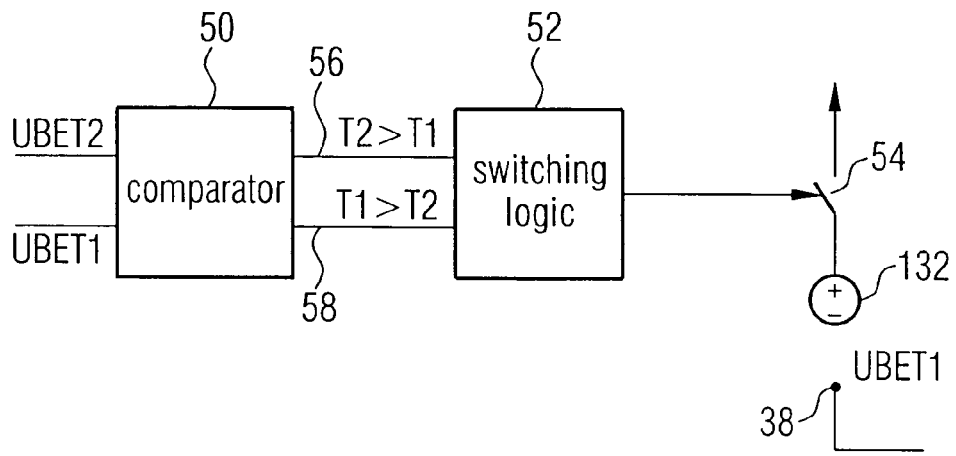
FIGS. 6–8 are embodiments of circuits for providing a current to the base of the amplifier transistor used in alternative embodiments of the present invention.
Figure 7:
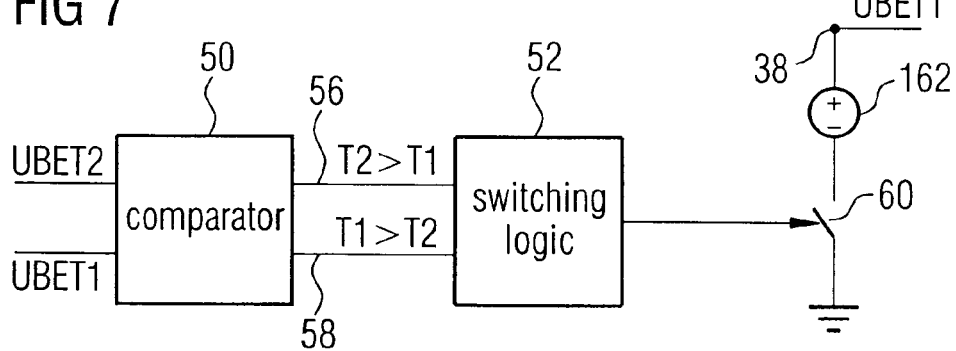
Figure 8:
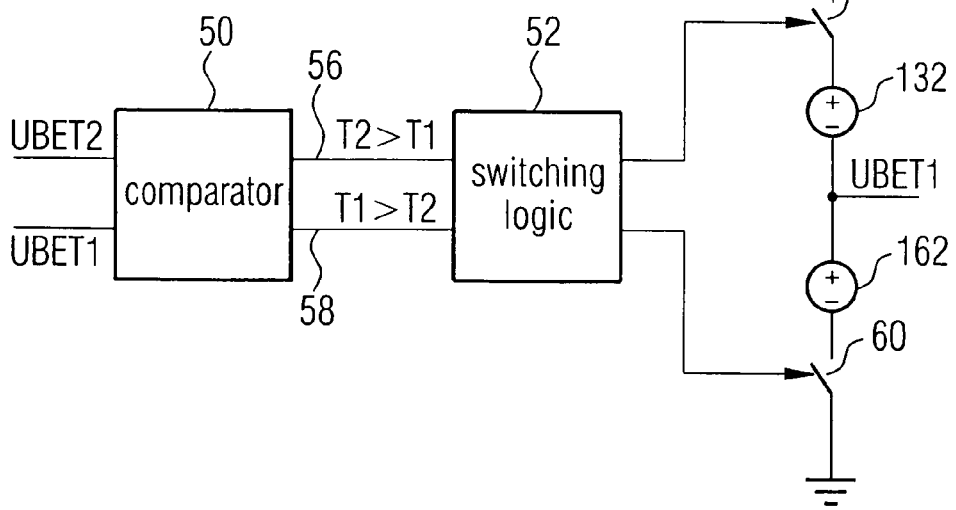

In FIGS. 6 to 8, embodiments of the present invention are shown where the current is provided to the base of the bipolar transistor through voltage sources. Thereby, the controls correspond to the controls shown in FIGS. 3 to 5, wherein a charging voltage source 162 and a discharging voltage source 132 are provided instead of the current source 32 and the current sink 62. By connecting the charging voltage source 132, the external capacitor $C_{ext}$ can be loaded, while by connecting the discharging voltage source 132, the capacitor can be discharged. Connecting the respective voltage sources causes a current flow to the base of the bipolar transistor, via which again the capacitor can be charged and discharged, respectively. In order to realize the embodiment shown in FIG. 2 by using a voltage source, the current source 32 would have to be replaced by a charge voltage source 162 as shown in FIG. 7.

Although a single stage LNA has been described above with reference to the figures, it is obvious for a person skilled in the art that any of a plurality of LNAs of a multistage low noise amplifier can comprise a circuitry as described above. Thus, the present invention allows fast switching between different stages of a multistage amplifier, by connecting or disconnecting one or several of the LNAs for such switching between stages. The plurality of LNAs for such a multistage amplifier are connected in parallel, by being connected at the HF input HFin and the HF output HFout.

Thus, the present invention provides a circuitry and a method enabling fast switching on and off of LNAs with minimum current consumption.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A circuit arrangement comprising:
an amplifier including a first bipolar transistor having a base terminal, wherein the base terminal of the first bipolar transistor is connected to an input terminal for a signal to be amplified;
a biasing circuit operable to set a potential at the base terminal of the first bipolar transistor, the biasing circuit comprising a second bipolar transistor including a base terminal, a reference current source and resistors, wherein the base terminals of the first and second bipolar transistors are connected to the reference current source across the resistors, wherein the first and second bipolar transistors are connected such that a potential change occurs faster at the base terminal of the second bipolar transistor than at the base terminal of the first bipolar transistor in response to switching on or off the reference current source;
an additional source configured to provide a current to the base terminal of the first bipolar transistor;
a detector operable to detect a potential difference between the potentials at the base terminals of the first and second bipolar transistors in order to detect whether the first bipolar transistor is to be switched by switching on or off the reference current source; and
a connector operable to connect the additional source to the base of the bipolar transistor when the first bipolar transistor is to be switched.

2. The circuit arrangement according to claim 1, wherein the additional source comprises a current source or a current sink.

3. The circuit arrangement according to claim 1, wherein the additional source comprises a voltage source.

4. The circuit arrangement according to claim 1, wherein the detector comprises a comparator operable to compare the potentials at the base terminals of the first and second bipolar transistors and further operable to output a first signal when the potential at the base terminal of the second bipolar transistor is higher than the potential at the base terminal of the first bipolar transistor or for outputting a second signal when the potential at the base terminal of the first bipolar transistor is higher than the potential at the base terminal of the second bipolar transistor.

5. The circuit arrangement according to claim 4, further comprising a switching logic operable to control the additional current source and charge the capacitor when the comparator outputs the first signal, or discharge the capacitor when the comparator outputs the second signal.

6. The circuit arrangement according to claim 1, wherein the first and second bipolar transistors are connected as a current mirror, wherein an input transistor of the current mirror is the second bipolar transistor, and wherein the input of the current mirror is connected to an output of the reference current source.

7. A method for accelerated switching of an amplifier by effecting a potential change at the base terminal of a first bipolar transistor of the amplifier, wherein the base terminal of the first bipolar transistor is coupled to an input terminal for an input signal to be amplified, and wherein a capacitor is coupled to the base terminal of the first bipolar transistor, the method comprising the steps of:
providing a biasing circuit operable to set a potential at the base terminal of the first bipolar transistor, wherein the biasing circuit comprises a second bipolar transistor, a reference current source and resistors, wherein the base terminals of the first and second bipolar transistors are connected to the reference current source across the resistors, and wherein the first and second bipolar transistors are connected such that a potential change occurs faster at the base terminal of the second bipolar transistor than at the base terminal of the first bipolar transistor in response to switching on or off the reference current source;
detecting a potential change between the potentials at the base terminals of the first and second bipolar transistors to detect whether the first bipolar transistor is to be switched by switching on or off the reference current source; and
connecting a source configured to provide a current to the base terminal of the first bipolar transistor.

8. The method according to claim 7, wherein the step of detecting comprises comparing a potential at a comparison node to the potential at the base terminal of the first bipolar transistor, and wherein the step of connecting comprises connecting a current source operable to charge the capacitor or connecting a current sink operable to discharge the capacitor in dependence on the comparison.

9. The method according to claim 8, wherein the current source is connected when the comparison shows that the potential at the comparison node exceeds the potential at the base terminal of the first bipolar transistor by a predetermined value, and wherein the current sink is connected when the comparison shows that the potential at the base terminal of the first bipolar transistor exceeds the potential at the comparison node by a predetermined value.

10. The method according to claim 7, wherein the step of detecting comprises comparing a potential at a comparison node to the potential at the base terminal of the first bipolar transistor, and wherein the step of connecting comprises connecting a voltage source operable to charge the capacitor or connecting a voltage source operable to discharge the capacitor in dependence on the comparison.

11. The method according to claim 10, wherein the voltage source operable to charge is connected when the comparison shows that the potential at the comparison node exceeds the potential at the base terminal of the first bipolar transistor by a predetermined value, and wherein the voltage source operable to discharge is connected when the comparison shows that the potential at the base terminal of the bipolar transistor exceeds the potential at the comparison node by a predetermined value.

12. The method according to claim 7 wherein the source is configured to provide the current to the base terminal of the first bipolar transistor such that the capacitor is charged or discharged with a charging or discharging current which is higher than a base current of the first bipolar transistor when the first bipolar transistor is to be switched.

13. An amplifier comprising:
an input adapted to receive a signal to be amplified;
a first transistor having a first terminal connected to the input;
a biasing circuit operable to set a potential at the control terminal of the first transistor, the biasing circuit comprising a second transistor including a first terminal and a source of a reference current, wherein the first terminal of the first transistor and the first terminal of the second transistor are each connected to the source of the reference current, wherein the first transistor and the second transistor are connected such that a potential change occurs faster at the first terminal of the second transistor than at the first terminal of the first transistor in response to switching on or off the source of the reference current;
an additional source configured to provide a current to the first terminal of the first transistor;
a detector operable to detect a potential difference between the potential at the first terminal of the first transistor and the potential at the first terminal of the second transistor; and
a connector operable to connect the additional source to the first terminal of the first transistor depending upon the detected difference between the potential at the first terminal of the first transistor and the first terminal of the second transistor.

14. The amplifier according to claim 13 wherein the first transistor is a bipolar transistor and the first terminal of the first bipolar transistor is a base terminal.

15. The amplifier according to claim 13 wherein the connector is a switch operable to complete a circuit connecting to the first terminal of the first transistor and the additional source.

16. The amplifier according to claim 13 wherein the additional source comprises a current source.

17. The amplifier according to claim 13 wherein the additional source comprises a current sink.

18. The amplifier according to claim 13, wherein the additional source comprises a voltage source.

19. The amplifier according to claim 13, wherein the detector comprises a comparator operable to compare the potential at the first terminals of the first transistor and the potential at the first terminal of the second transistor, and wherein the detector is operable to output a first signal when the potential at the first terminal of the second transistor is higher than the potential at the first terminal of the first transistor or output a second signal when the potential at the first terminal of the first transistor is higher than the potential at the first terminal of the second transistor.

20. The amplifier according to claim 19 wherein the detector further comprises a switching logic operable to control the additional current source.

* * * * *